United States Patent
Pan

(10) Patent No.: US 9,613,949 B1
(45) Date of Patent: Apr. 4, 2017

(54) BIPOLAR JUNCTION TRANSISTOR AND DIODE

(71) Applicant: UNITED MICROELECTRONICS CORP., Hsin-Chu (TW)

(72) Inventor: Chen-Wei Pan, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/194,518

(22) Filed: Jun. 27, 2016

(51) Int. Cl.

| | | |
|---|---|---|
| *H01L 29/78* | (2006.01) | |
| *H01L 27/00* | (2006.01) | |
| *H01L 27/06* | (2006.01) | |
| *H01L 29/167* | (2006.01) | |
| *H01L 29/161* | (2006.01) | |
| *H01L 29/16* | (2006.01) | |
| *H01L 29/10* | (2006.01) | |
| *H01L 29/08* | (2006.01) | |
| *H01L 29/861* | (2006.01) | |
| *H01L 29/73* | (2006.01) | |

(52) U.S. Cl.
CPC ...... *H01L 27/0635* (2013.01); *H01L 29/0804* (2013.01); *H01L 29/0821* (2013.01); *H01L 29/1004* (2013.01); *H01L 29/161* (2013.01); *H01L 29/167* (2013.01); *H01L 29/1608* (2013.01); *H01L 29/73* (2013.01); *H01L 29/861* (2013.01); *H01L 29/785* (2013.01)

(58) Field of Classification Search
CPC . H01L 29/0804; H01L 29/0821; H01L 27/00; H01L 27/0635; H01L 27/0826; H01L 27/7322; H01L 29/161; H01L 29/167; H01L 29/73; H01L 29/1004; H01L 29/1608; H01L 29/861; H01L 29/78; H01L 29/785; H01L 29/808; H01L 29/1066; H01L 29/7322; H01L 29/66242; H01L 29/66272; H01L 29/7378
USPC ......... 257/77, 110, 134, 272, 287, 273, 302, 257/256, 378, 511, 525, 526, 517, 552, 257/565

See application file for complete search history.

(56) References Cited

U.S. PATENT DOCUMENTS

| | | | |
|---|---|---|---|
| 8,610,241 B1 | 12/2013 | Hu | |
| 2009/0124097 A1* | 5/2009 | Cheng | ................. H01L 21/3086 438/792 |
| 2010/0232200 A1* | 9/2010 | Shepard | ............. G11C 13/0004 365/51 |
| 2014/0131831 A1 | 5/2014 | Wei | |
| 2014/0252481 A1* | 9/2014 | Flachowsky | ...... H01L 29/42392 257/349 |

OTHER PUBLICATIONS

Singh, "Analog, RF, and ESD Device Challenges and Solutions for 14nm FinFET Technology and Beyond", 2014 Symposium on VLSI Technology Digest of Technical Papers.

* cited by examiner

*Primary Examiner* — Chuong A Luu
(74) *Attorney, Agent, or Firm* — Winston Hsu; Scott Margo

(57) ABSTRACT

A bipolar junction transistor (BJT) and a diode including fin structures are provided in the present invention. In the BJT and the diode of the present invention, first doped layers are formed in a first fin and below first epitaxial structures in the first fin, and the first doped layers are connected with one another for improving related electrical performance of the BJT and the diode including fin structures.

20 Claims, 5 Drawing Sheets

BIPOLAR JUNCTION TRANSISTOR AND DIODE

BACKGROUND OF THE INVENTION

1. Field of the Invention

The present invention relates to a semiconductor device, and more particularly, to a bipolar junction transistor (BJT) and a diode.

2. Description of the Prior Art

In recent years, as various kinds of consumer electronic products are being constantly modified towards increased miniaturization, the size of semiconductor components are modified to be reduced accordingly, in order to meet high integration, high performance, low power consumption, and the demand of products. However, with the increasing miniaturization of electronic products, current planar field effect transistors (FETs) no longer meet the requirements of the products. Thus, there is a development for non-planar FETs such as Fin-FETs to achieve a high drive current and to lessen the short channel effect.

However, integrated circuit (IC) devices including complementary metal oxide semiconductor CMOS FinFETs also require other semiconductor structures and transistors, such as diodes and bipolar junction transistors (BJTs). These other semiconductor structures and transistors are formed alongside and concurrently with the FinFETs using the same materials and processes preferably. Because the Fin-FET basically has a three-dimensional structure, the forming method thereof is more complicated than that of the traditional structure, and it is difficult to integrate Fin-FET forming method into conventional planar FET forming method and the method of forming other semiconductor structures and transistors.

SUMMARY OF THE INVENTION

A bipolar junction transistor (BJT) and a diode are provided in the present invention. In the BJT and the diode of the present invention, first doped layers are formed in a first fin and below first epitaxial structures in the first fin, and the first doped layers are connected with one another for improving related electrical performance of the BJT and the diode including fin structures.

According to an embodiment of the present invention, a bipolar junction transistor (BJT) is provided. The BJT includes a semiconductor substrate, a first conductivity type well, a second conductivity type well, a plurality of first epitaxial structures, and a plurality of first doped layers. The semiconductor substrate includes a first fin in a first region, a second fin in a second region adjacent to the first region, and a third fin in a third region. The second region is located between the first region and the third region. The first conductivity type well is disposed in the first region and the second region. The second conductivity type well is disposed in the third region. The first epitaxial structures and the first doped layers are disposed in the first fin. Each of the first doped layers is disposed below and surrounds one of the first epitaxial structures in the first fin, and the first doped layers are connected with one another.

According to an embodiment of the present invention, a diode is provided. The diode includes a semiconductor substrate, a first conductivity type well, a plurality of first epitaxial structures, and a plurality of first doped layers. The semiconductor substrate includes a first fin in a first region; and a second fin in a second region adjacent to the first region. The first conductivity type well is disposed in the first region and the second region. The first epitaxial structures and the first doped layers are disposed in the first fin. Each of the first doped layers is disposed below and surrounds one of the first epitaxial structures in the first fin, and the first doped layers are connected with one another.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 3-5 are schematic drawings illustrating a method of fabricating the bipolar junction transistor according to some embodiments of the present invention, wherein FIG. 4 is a schematic drawing in a step subsequent to FIG. 3, and FIG. 5 is a schematic drawing in a step subsequent to FIG. 4.

DETAILED DESCRIPTION

Figure 1:
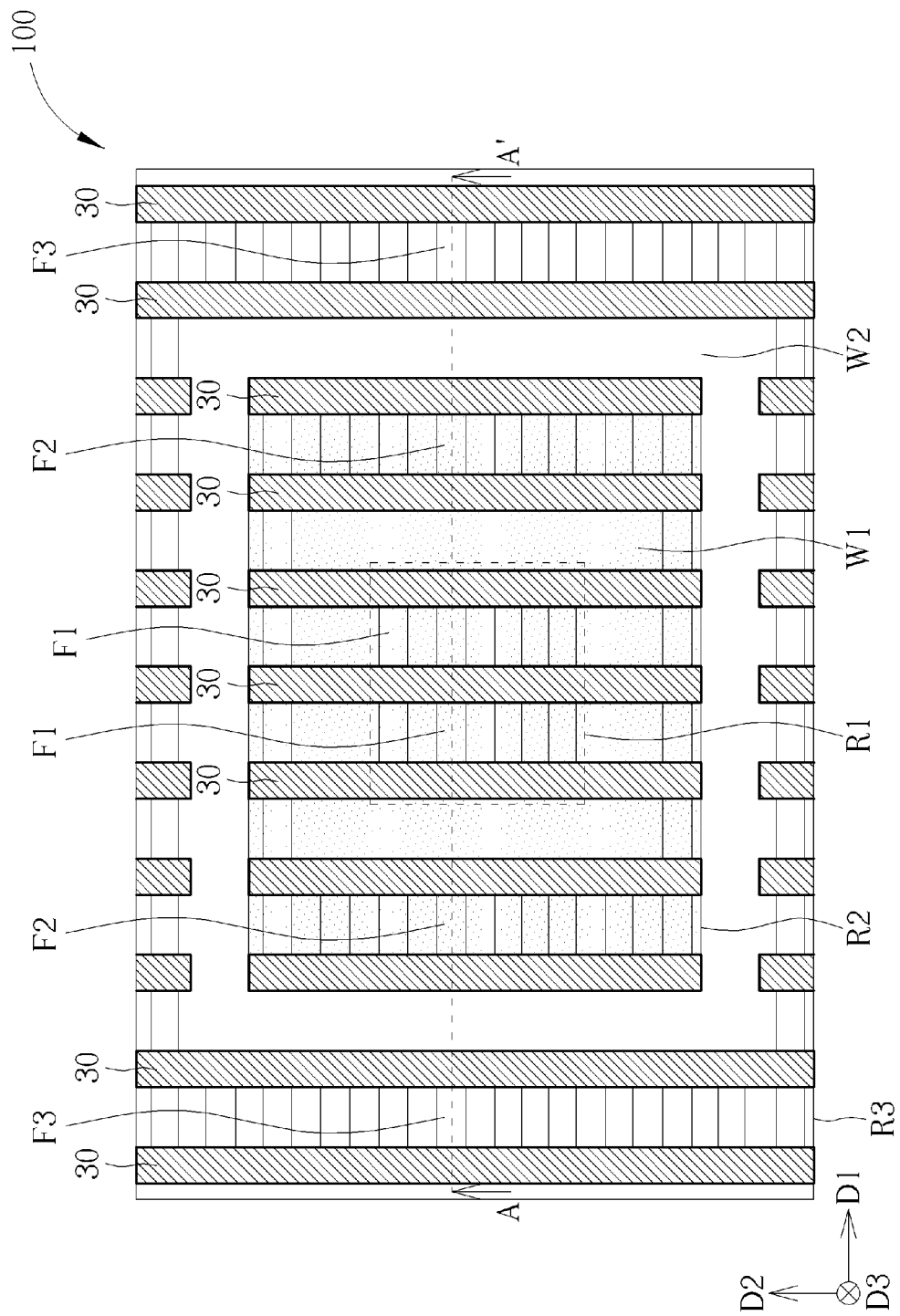
FIG. 1 is a schematic drawing illustrating a bipolar junction transistor according to a first embodiment of the present invention.
Figure 2:
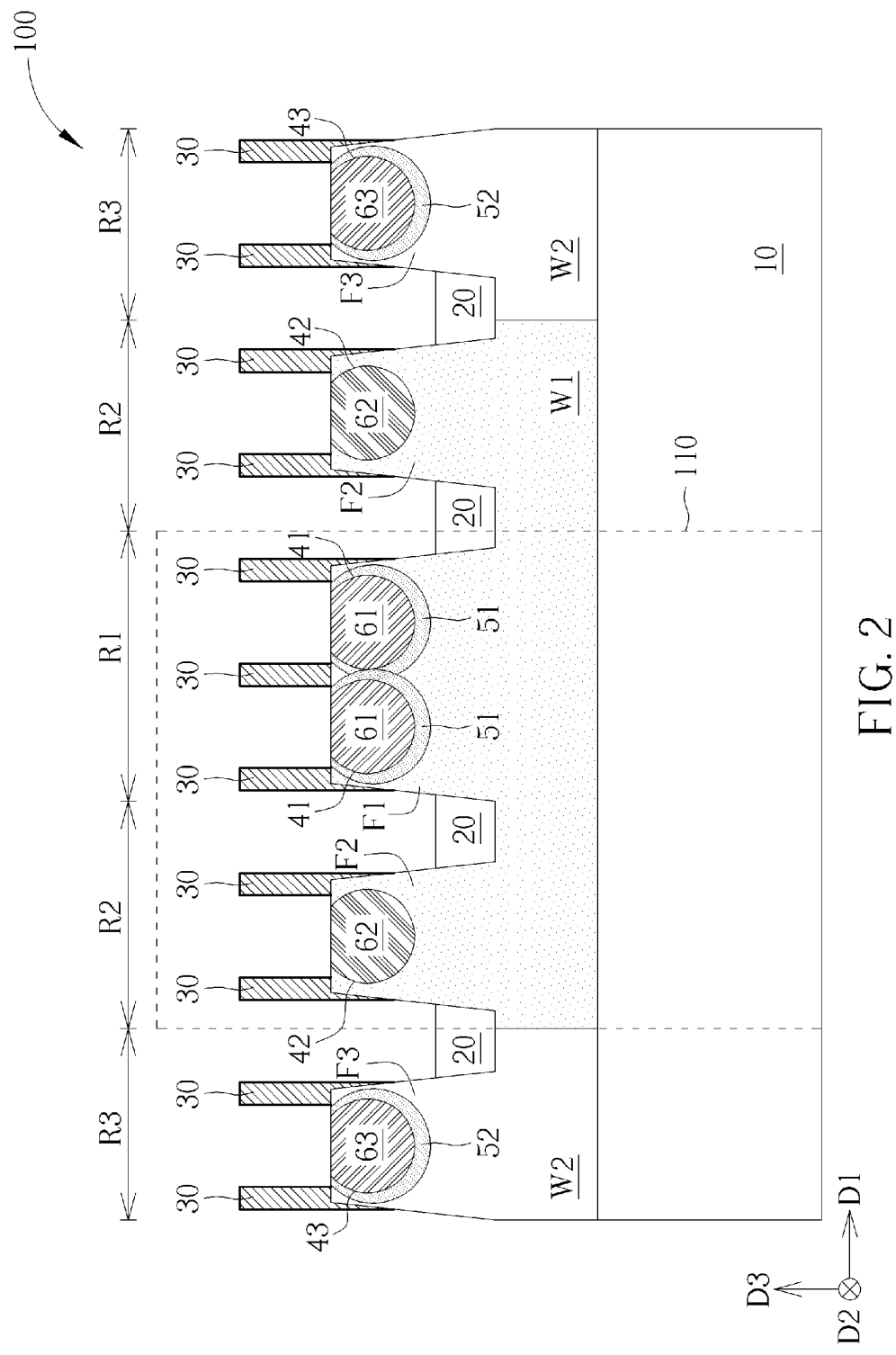
FIG. 2 is a cross-sectional diagram taken along a line A-A' in FIG. 1.

Please refer to FIG. 1 and FIG. 2. FIG. 1 is a schematic drawing illustrating a bipolar junction transistor (BJT) according to a first embodiment of the present invention. FIG. 2 is a cross-sectional diagram taken along a line A-A' in FIG. 1. As shown in FIG. 1 and FIG. 2, a BJT 100 is provided. The BJT 100 includes a semiconductor substrate 10, a first conductivity type well W1, a second conductivity type well W2, a plurality of first epitaxial structures 61, and a plurality of first doped layers 51. In some embodiments of the present invention, the semiconductor substrate 10 may include silicon substrate, epitaxial substrate, silicon carbide substrate, or silicon-on-insulator (SOI) substrate, but not limited thereto. Other kinds of semiconductor substrates are within the contemplated scope of the present invention. In this embodiment, the semiconductor substrate 100 includes a first fin F1 in a first region R1, a second fin F2 in a second region R2, and a third fin F3 in a third region R3. The second region R2 is located adjacent to the first region R1, the third region R3 is located adjacent to the second region R2, and the second region R2 is located between the first region R1 and the third region R3. For example, the second region R2 may surround the first region R1, and the third region R3 may surround the second region R2 and the first region R1, but the present invention is not limited to this. In some embodiments of the present invention, the first region R1, the second region R2, and the third region R3 may be disposed parallel with one another or be disposed in other configurations.

In this embodiment, there may be a plurality of the first fins F1 formed in the first region R1, a plurality of the second fins F2 formed in the second region R2, and a plurality of the third fins F3 formed in the third region R3. The first fins F1, the second fins F2, and the third fins F3 may be formed protruding in a vertical direction D3 and elongated in a first direction D1, and a shallow trench isolation (STI) 20 may be formed between the first fins F1, the second fins F2, and the third fins F3 for separating the first fins F1, the second fins F2, and the third fins F3 from one another. The first conductivity type well W1 is disposed in the first region R1 and the second region R2. The second conductivity type well W2 is disposed in the third region R3. The second conductivity type is complementary to the first conductivity type. For example, the first conductivity type may be n-type as the second conductivity type is p-type, or the first conductivity type may be p-type as the second conductivity type is n-type. Additionally, the semiconductor substrate 10 may be a second conductivity type substrate, such as a p-type substrate, but the present invention is not limited to this. In other embodiments of the present invention, a first conductivity type substrate with a second conductivity type deep well formed under the first conductivity type well W1 and the second conductivity type well W2 may also be applied for forming the BJT and/or a diode of the present invention.

The first fins F1 in the first region R1 and the second fins F2 in the second region R2 are electrically connected to the first conductivity type well W1, and the third fins F3 in the third region R3 are electrically connected to the second conductivity type well W2. In some embodiments, the first fins F1 and the second fins F2 may be first conductivity type fins directly connected to the first conductivity type well W1, and the third fins F3 may be second conductivity type fins directly connected to the second conductivity type well W2, but not limited thereto. In this embodiment, the first epitaxial structures 61 and the first doped layers 51 are disposed in the first fin F1. Each of the first doped layers 51 is disposed below one of the first epitaxial structures 61 in the first fin F1, and each of the first doped layers 51 surrounds the corresponding first epitaxial structure 61 in the first fin F1. The first doped layers 51 in the same first fin F1 are connected with one another. Each of the first doped layers 51 includes a second conductivity type doped layer, and each of the first epitaxial structures 61 includes a second conductivity type epitaxial material. For example, each of the first doped layers 51 may include a boron doped layer, a phosphorus doped layer, an arsenic doped layer, or layers doped with other appropriate dopants according to the desired conductivity, and the second conductivity type epitaxial material of the first epitaxial structures 61 may include silicon germanium (SiGe), silicon carbide (SiC), silicon phosphorus (SiP), or other appropriate epitaxial materials. Each of the first doped layers 51 may surround and contact the corresponding first epitaxial structure 61 in the first fin F1, and the first epitaxial structures 61 in the first fin F1 are electrically connected with one another via the corresponding first doped layers 51.

In this embodiment, the BJT 100 may further include a plurality of gate structures 30 disposed on the semiconductor substrate 10. Each of the first fins F1 is elongated in a first direction D1, each of the gate structures 30 is elongated in a second direction D2 different from the first direction D1, and at least one of the gate structures 30 is disposed straddling the first fins F1. The first direction D1 and the second direction D2 may be orthogonal to each other, but not limited thereto. In some embodiments, the second fins F2 and the third fins F3 may also be elongated in the first direction D1, some of the gate structures 30 may be disposed straddling the second fins F2, and some of the gate structures 30 may be disposed straddling the third fins F3. The gate structure 30 may include a dummy gate applied in a replacement metal gate (RMG) process, but not limited thereto. In other words, the manufacturing processes of the BJT and the diode in the present invention may be integrated with the processes of forming fin type MOSFETs for simplifying the related processes. For example, each of the gate structures 30 may include a stacked structure composed of a patterned gate dielectric layer (not shown), a patterned gate material layer (not shown), and a patterned hard mask layer (not shown), and one or more sidewall spacers (not shown) formed on the sidewalls of the stacked structure. As the gate structures applied in the RMG process are well known to those skilled in the art, the details of which are not explained herein for the sake of brevity.

Figure 4:
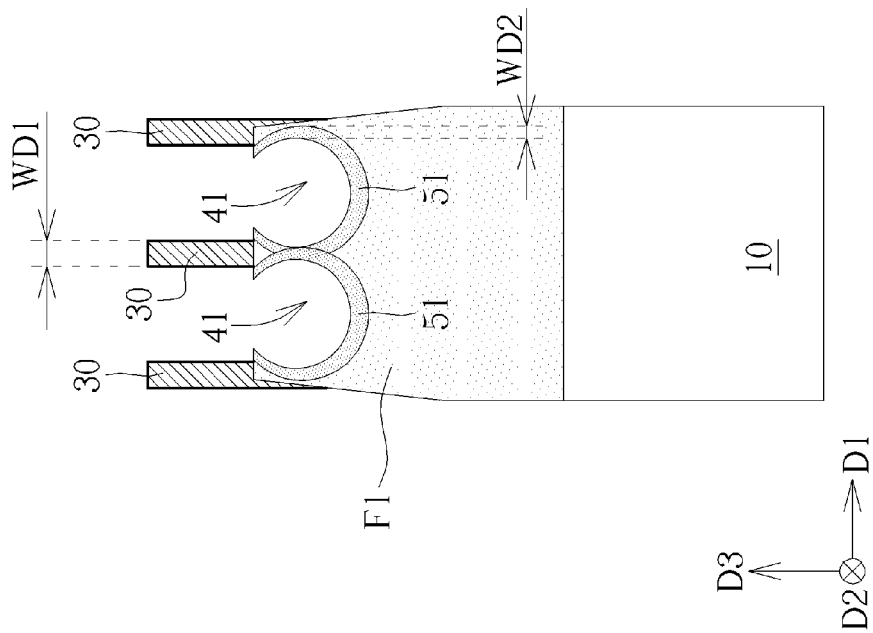
Figure 3:
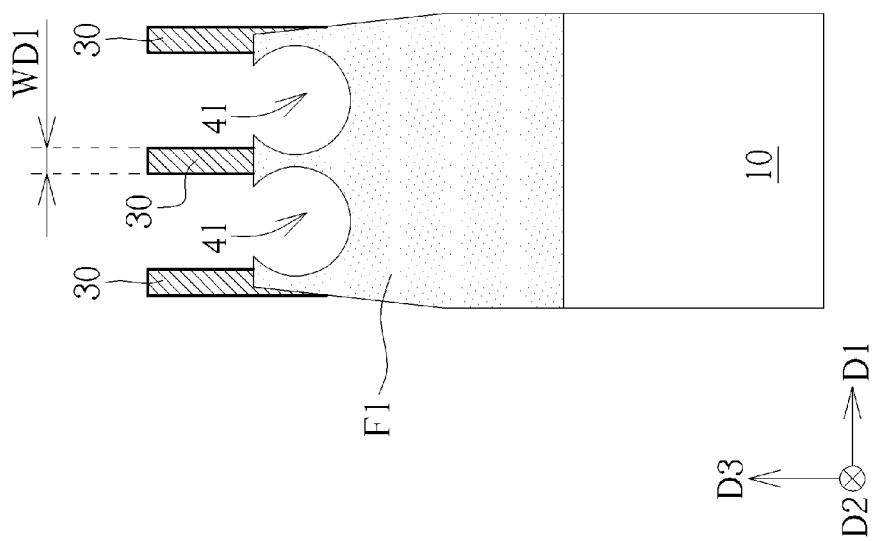
Figure 5:
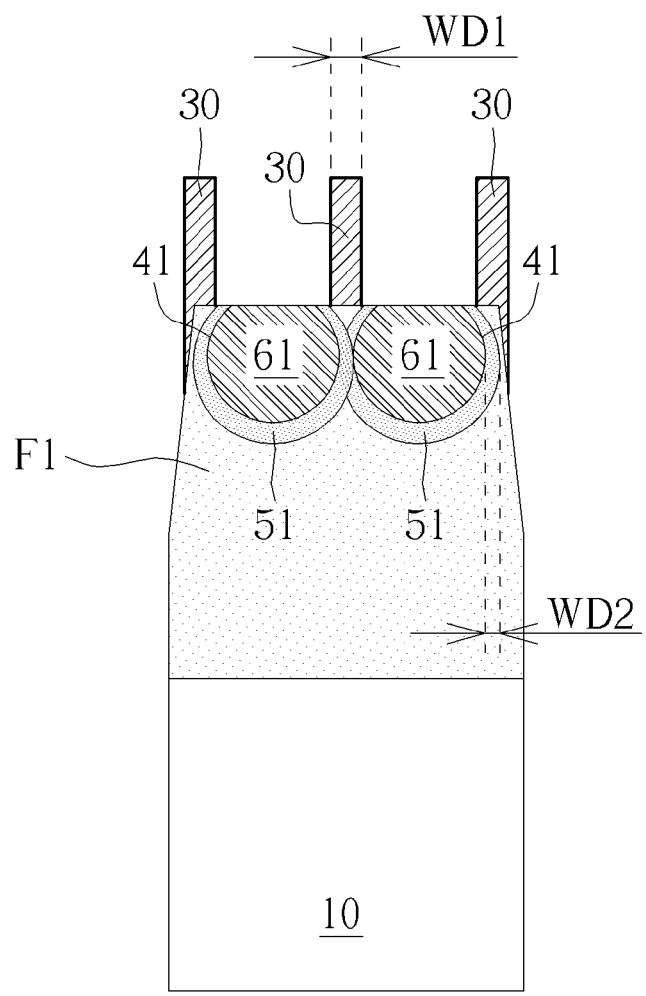
Figure 5:
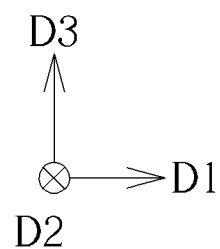

As shown in FIG. 1 and FIG. 2, at least two of the first epitaxial structures 61 are disposed at two opposite sides of the gate structure 30 in the first direction D1. Please refer to FIG. 3, FIG. 4, and FIG. 5. FIGS. 3-5 are schematic drawings illustrating a method of fabricating the BJT according to some embodiments of the present invention, FIG. 4 is a schematic drawing in a step subsequent to FIG. 3, and FIG. 5 is a schematic drawing in a step subsequent to FIG. 4. As shown in FIG. 3, a plurality of recesses 41 may be formed in the first fin F1 after the step of forming the gate structures 30 on the semiconductor substrate 10, and the recesses 41 are separated from each other. An etching process may be conducted by using the gate structure 30 and other patterned mask (not shown) to etch the first fin F1 for forming the recesses 41 in the first fin F1 and adjacent to each of the gate structures 30. The etching process may include a single etching process or a multiple etching process so as to vertically etch the first fin F1 uncovered by the gate structure 30 and to laterally etch the first fin F1 directly under the gate structure 30 for further expanding the volume of the recess 41. The recess 41 in this embodiment may be a circular shaped recess by modifying the process parameters such as the bias power of the etching process, but not limited thereto.

As shown in FIG. 4, the first doped layers 51 may then be formed in the first fin F1 and below the recesses 41 by a process such as an implantation process, a plasma treatment, a seed layer process, or other appropriate processes. A thickness WD2 of each of the first doped layers 51 in the first direction D1 may be larger than a half of a width WD1 of the gate structure 30 straddling the first fin F1 preferably for ensuring that the two adjacent first doped layers 51 formed at two opposite sides of the corresponding gate structure 30 are directly connected with each other. The thickness WD2 of the first doped layer 51 may be modified by controlling the process parameters of the implantation process (such as the implantation energy) and/or the subsequent thermal or laser treatments. In addition, each of the first doped layers 51 may has an uniform thickness surrounding the recess 41 and the subsequently formed first epitaxial structure. Accordingly, in some embodiments, there may be an undoped region of the first fin F1 between two adjacent first doped layers 51 and under the gate structure 30, but not limited thereto.

As shown in FIG. 5, the first epitaxial structures 61 may be formed in the recesses 61 respectively by an epitaxial process. For example, a selective epitaxial growth (SEG) process may be conducted to form the first epitaxial structures 61, and the recess 41 may be filled with the first epitaxial structure 61. In some embodiments, some of the first epitaxial structure 61 may even protrude upwardly from the recess 41. A cleaning process can be performed before the epitaxial process, and a buffer layer (not shown) with relatively lower concentration (such as the germanium concentration) may be conformally formed on the inner wall of the recess 41 for reducing structural defect of the first epitaxial structure 61. It is worth noting that the manufacturing method of the BJT is not limited to the approaches described above. The first doped layer 51 and the first epitaxial structure 61 may also be formed by other process in some embodiments of the present invention.

As shown in FIG. 1 and FIG. 2, the BJT 100 may further include a second epitaxial structure 62 disposed in the second fin F2, and a third epitaxial structure 63 disposed in the third fin F3. The second epitaxial structure 62 may be formed in a recess 42 in the second fin F2 and between the gate structures 30 formed on the second fin F2. The third epitaxial structure 63 may be formed in a recess 43 in the third fin F3 and between the gate structures 30 formed on the third fin F3. The manufacturing approach of the second epitaxial structure 62 and the third epitaxial structure 63 may be similar to that of the first epitaxial structure 61 described above, but not limited thereto. For example, the recess 41 and the recess 43 may be formed by the same etching process. The second epitaxial structure 62 may include a first conductivity type epitaxial material, and the third epitaxial structure 63 may include a second conductivity type epitaxial material. Therefore, the third epitaxial structure 63 may be formed by the process of forming the first epitaxial structure 61, but not limited thereto. For example, when the BJT 100 is a PNP BJT, the first conductivity type well W1 is an N-type well, the second conductivity type well W2 is a P-type well, the first epitaxial structure 61 is a p+ epitaxial structure (such as p+ SiGe), the second epitaxial structure 62 is an n+ epitaxial structure (such as n+ SiP), and the third epitaxial structure 63 is a p+ epitaxial structure. Additionally, when the BJT 100 is a NPN BJT, the first conductivity type well W1 is a P-type well, the second conductivity type well W2 is an N-type well, the first epitaxial structure 61 is an n+ epitaxial structure, the second epitaxial structure 62 is a p+ epitaxial structure, and the third epitaxial structure 63 is an n+ epitaxial structure. In other words, the first region R1 may be regarded as an emitter region, the second region R2 may be regarded as a base region, and the third region R3 may be regarded as a collector region. Because the first doped layers 51 are connected with one another in the first fin F1, the distribution of the distance between the first doped layers 51 and the bottom of the first conductivity type well W1 (may be regarded as the base width of the BJT 100) may become more uniform in comparison with the condition of a BJT having two adjacent first doped layers separated from each other in the first fin. The collector current variation between the bipolar junction transistors 100 may be reduced and the collector current mismatch may also be reduced accordingly.

In some embodiments, the BJT 100 may further include a second doped layer 52 disposed in the third fin F3 and below the third epitaxial structure 63. The second doped layer 52 may surround and contact the third epitaxial structure 63 in the third fin F3, and the second doped layer 52 may include a second conductivity type doped layer. In some embodiments, the second doped layer 52 may be formed by the process of forming the first doped layer 51, but not limited thereto. The dopant concentration of the second doped layer 52 may be identical to or different from that of the first doped layer 51.

In addition, the first region R1 and the second region R2 may be regarded as a diode 110. In other words, the diode 110 includes the semiconductor substrate 10, the first conductivity type well W1, a plurality of the first epitaxial structures 61, and a plurality of first doped layers 51. The first conductivity type well W1 is disposed in the first region R1 and the second region R2. The first epitaxial structures 61 and the first doped layers 51 are disposed in the first fin F1. Each of the first doped layers 51 is disposed below and surrounds one of the first epitaxial structures 61 in the first fin F1, and the first doped layers 51 are connected with one another. The diode 110 further include the gate structures 30 and the second epitaxial structure 62, and the features of the substrate 10, the first fin F1, the second fin F2, the first conductivity type well W1, the first doped layer 51, the first epitaxial structure 61, the second epitaxial structure 62, and the gate structure 30 of the diode 110 have been detailed in the above content and will not be redundantly described.

Figure 6:
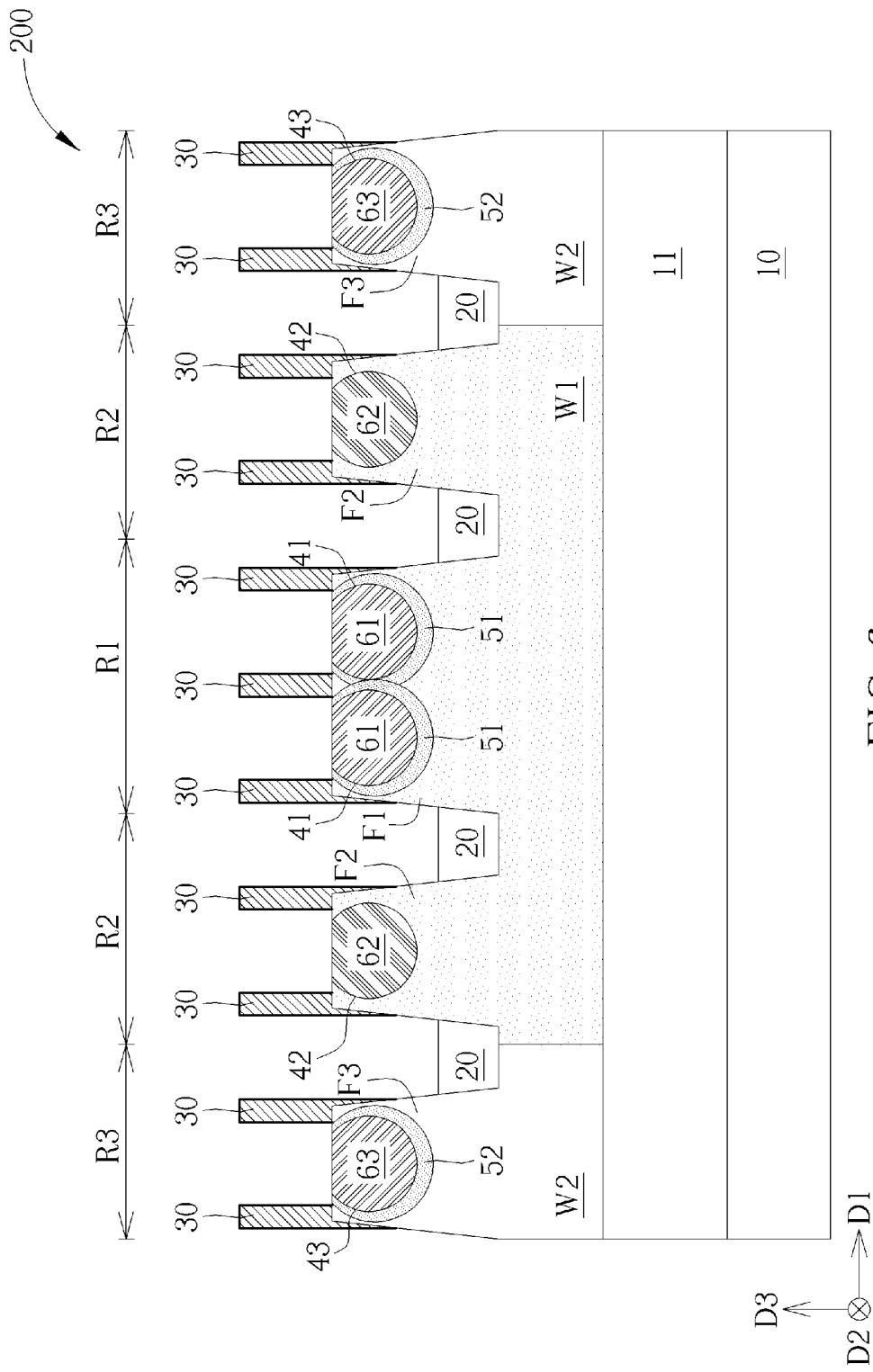
FIG. 6 is a schematic drawing illustrating a bipolar junction transistor according to a second embodiment of the present invention.

Please refer to FIG. 6. FIG. 6 is a schematic drawing illustrating a BJT 200 according to a second embodiment of the present invention. As shown in FIG. 6, the differences between the BJT 200 of this embodiment and the BJT of the first embodiment mentioned above is that the BJT 200 further includes a deep well 11 disposed in the semiconductor substrate 10 and below the first conductivity type well W1 and the second conductivity type well W2. The conductivity type of the deep well 11 may be complementary to the conductivity type of the semiconductor substrate 10. For example, when the BJT 200 is a NPN BJT and the semiconductor substrate 10 is a P-type substrate, the deep well 11 may be a deep N-type well formed in the semiconductor substrate 10.

To summarize the above descriptions, in the BJT and the diode of the present invention, the first doped layers are formed in the first fin and below the first epitaxial structures in the first fin, and the first doped layers are connected with one another for improving the uniformity of the base width in the BJT. The related electrical performance, such as the collector current variation and the collector current mismatch of the BJT including fin structures are improved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A bipolar junction transistor (BJT), comprising:
   a semiconductor substrate, comprising:
      a first fin in a first region;
      a second fin in a second region adjacent to the first region; and
      a third fin in a third region, wherein the second region is located between the first region and the third region;
   a first conductivity type well in the first region and the second region;
   a second conductivity type well in the third region;
   a plurality of first epitaxial structures disposed in the first fin; and
   a plurality of first doped layers disposed in the first fin, wherein each of the first doped layers is disposed below and surrounds one of the first epitaxial structures in the first fin, and the first doped layers are connected with one another.

2. The BJT of claim 1, wherein each of the first doped layers comprises a second conductivity type doped layer, and the first fins comprise first conductivity type fins connected to the first conductivity type well.

3. The BJT of claim 2, wherein each of the first doped layers comprises a boron doped layer, a phosphorus doped layer, or an arsenic doped layer.

4. The BJT of claim 1, wherein each of the first epitaxial structures comprises a second conductivity type epitaxial material.

5. The BJT of claim 4, wherein the first epitaxial structures are electrically connected with one another via the first doped layers.

6. The BJT of claim 4, wherein the second conductivity type epitaxial material comprises silicon germanium, silicon carbide, or silicon phosphorus.

7. The BJT of claim 1, further comprising:
a plurality of gate structures disposed on the semiconductor substrate, wherein the first fin is elongated in a first direction, each of the gate structures is elongated in a second direction, and at least one of the gate structures is disposed straddling the first fin.

8. The BJT of claim 7, wherein at least two of the first epitaxial structures are disposed at two opposite sides of one of the gate structures in the first direction.

9. The BJT of claim 7, wherein a thickness of each of the first doped layers in the first direction is larger than a half of a width of the gate structure straddling the first fin.

10. The BJT of claim 1, further comprising:
a second epitaxial structure disposed in the second fin, wherein the second epitaxial structure comprises a first conductivity type epitaxial material; and
a third epitaxial structure disposed in the third fin, wherein the third epitaxial structure comprises a second conductivity type epitaxial material.

11. The BJT of claim 10, further comprising:
a second doped layer disposed in the third fin and below the third epitaxial structure, wherein the second doped layer surrounds the third epitaxial structure in the third fin, the second doped layer comprises a second conductivity type doped layer, and the third fin comprises a second conductivity type fin connected to the second conductivity type well.

12. The BJT of claim 1, further comprising:
a deep well disposed in the semiconductor substrate and below the first conductivity type well and the second conductivity type well.

13. A diode, comprising:
a semiconductor substrate, comprising:
a first fin in a first region; and
a second fin in a second region adjacent to the first region;
a first conductivity type well in the first region and the second region;
a plurality of first epitaxial structures disposed in the first fin; and
a plurality of first doped layers disposed in the first fin, wherein each of the first doped layers is disposed below and surrounds one of the first epitaxial structures in the first fin, and the first doped layers are connected with one another.

14. The diode of claim 13, wherein each of the first doped layers comprises a second conductivity type doped layer, and the first fins comprise first conductivity type fins connected to the first conductivity type well.

15. The diode of claim 13, wherein each of the first epitaxial structures comprises a second conductivity type epitaxial material.

16. The diode of claim 15, wherein the first epitaxial structures are electrically connected with one another via the first doped layers.

17. The diode of claim 13, further comprising:
a plurality of gate structures disposed on the semiconductor substrate, wherein the first fin is elongated in a first direction, each of the gate structures is elongated in a second direction, and at least one of the gate structures is disposed straddling the first fin.

18. The diode of claim 17, wherein at least two of the first epitaxial structures are disposed at two opposite sides of one of the gate structures in the first direction.

19. The diode of claim 17, wherein a thickness of each of the first doped layers in the first direction is larger than a half of a width of the gate structure straddling the first fin.

20. The diode of claim 13, further comprising:
a second epitaxial structure disposed in the second fin, wherein the second epitaxial structure comprises a first conductivity type epitaxial material, and the second fin comprises a first conductivity type fin connected to the first conductivity type well.

* * * * *